US010160001B2

(12) United States Patent
Park

(10) Patent No.: US 10,160,001 B2
(45) Date of Patent: Dec. 25, 2018

(54) SUBSTRATE TREATING APPARATUS

(71) Applicant: SEMES CO., LTD., Chungcheongnam-do (KR)

(72) Inventor: Gilsoo Park, Gyeonggi-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 15/332,184

(22) Filed: Oct. 24, 2016

(65) Prior Publication Data
US 2017/0120287 A1    May 4, 2017

(30) Foreign Application Priority Data
Oct. 29, 2015   (KR) .................. 10-2015-0151105

(51) Int. Cl.
*B05C 1/00* (2006.01)
*H01L 21/67* (2006.01)
*H01L 21/677* (2006.01)

(52) U.S. Cl.
CPC .......... *B05C 1/003* (2013.01); *H01L 21/6719* (2013.01); *H01L 21/67178* (2013.01); *H01L 21/67184* (2013.01); *H01L 21/67748* (2013.01); *H01L 21/67769* (2013.01)

(58) Field of Classification Search
None
See application file for complete search history.

(56) References Cited

U.S. PATENT DOCUMENTS

| 5,730,801 | A | * | 3/1998 | Tepman | ............... | H01L 21/6719 |
| | | | | | | 118/715 |
| 5,783,055 | A | * | 7/1998 | Kamei | ................... | C23C 14/568 |
| | | | | | | 204/298.04 |
| 2014/0152966 | A1 | * | 6/2014 | Hwang | ................... | G03F 7/162 |
| | | | | | | 355/27 |

FOREIGN PATENT DOCUMENTS

| KR | 10-0387418 B1 | 6/2003 |
|---|---|---|
| KR | 2003-0047975 A | 6/2003 |
| KR | 2006-0012530 A | 2/2006 |
| KR | 10-1109074 B1 | 2/2012 |
| KR | 2015-0012846 A | 2/2015 |
| KR | 2015-0060086 A | 6/2015 |
| KR | 10-1579510 B1 | 12/2015 |

* cited by examiner

*Primary Examiner* — Jethro M. Pence
(74) *Attorney, Agent, or Firm* — Carter, Deluca, Farrell & Schmidt, LLP

(57) ABSTRACT

An apparatus for treating a substrate is provided having a treating module, a buffer module, and an index module arranged in sequentially along a first direction. The index module includes a load port where a substrate receiving container places an index module configured to transfer the substrate between the load port and the buffer module. The buffer module includes a first and second buffer unit arranged along a second direction perpendicular to the first direction. The treating module includes a first treating unit, a second treating unit, a first transfer chamber, and a second transfer chamber, wherein the first transfer chamber includes a first transfer robot configured to transfer the substrate between the first buffer unit and the first treating unit, and wherein the second transfer chamber includes a second transfer robot configured to transfer the substrate between the second buffer unit and the second treating unit.

18 Claims, 6 Drawing Sheets

SUBSTRATE TREATING APPARATUS

CROSS-REFERENCE TO RELATED APPLICATIONS

A claim for priority under 35 U.S.C. § 119 is made to Korean Patent Application No. 10-2015-0151105 filed on Oct. 29, 2015 in the Korean Intellectual Property Office, the entire contents of which are hereby incorporated by reference.

BACKGROUND OF THE INVENTION

The present invention disclosed herein relates to an apparatus for treating a substrate.

Variety processes such as picture, etching, ashing, film deposition, and cleaning process, etc. are performed in a manufacturing process of semiconductor device and flat display panel. In the film deposition process, a Spin-on-Harddisk (SOH) process depositing a chemical on a rotating substrate is performed.

FIG. 1 is an example of substrate treating apparatus performing a conventional SOH process. One transfer robot 350 is provided within a transfer chamber 300. And the transfer robot 350 moves along a direction X1 where the chambers 400 are arranged to transfer a substrate to each chamber 400. Therefore, a process time lengthens because of a broad range movement of the transfer robot 350. Also, a vortex was generated between both ends of the X1 direction of the substrate treating apparatus because of the movement of the transfer robot 350 along X1 direction. This vortex causes a process defect. Also, there was a problem miniaturizing the substrate treating apparatus because of a layout and arrangement of each component.

SUMMARY OF THE INVENTION

The present invention provides a substrate treating apparatus which may shorten a process time.

Also, the present invention provides a substrate treating apparatus which may decrease moving distance and moving time of a transfer robot.

Also, the present invention provides a substrate treating apparatus which may minimize a vortex generating from inner side.

Also, the present invention provides a substrate treating apparatus which may miniaturize equipment.

The objects of the inventive concept are not limited hereinafter, and other objects thereof will be understandable by those skilled in the art from the following descriptions.

The present invention provides a substrate treating apparatus.

According to an embodiment of the present invention, the substrate treating apparatus comprises an index module, a buffer module, and a treating module placed sequentially along a first direction. The index module comprises a load port where a substrate receiving container places and an index module configured to transfer the substrate between the load port and the buffer module. The buffer module comprises a first buffer unit and a second buffer unit arranged along a second direction perpendicular to the first direction, when viewed from a top side. The treating module comprises a first treating unit, a second treating unit, a first transfer chamber, and a second transfer chamber, wherein the first transfer chamber is provided with a first transfer robot configured to transfer the substrate between the first buffer unit and the first treating unit, and wherein the second transfer chamber is provided with a second transfer robot configured to transfer the substrate between the second buffer unit and the second treating unit. The first transfer chamber and the second transfer chamber are arranged along the second direction.

According to an embodiment, the first buffer unit comprises a first buffer chamber where a substrate temporarily stays and a first cooling chamber configured to cool the substrate, and is stacked with the first buffer chamber.

According to an embodiment, the first cooling chamber comprises one or a plurality of carry in cooling chambers and one or a plurality of carry out cooling chambers, wherein the carry in cooling chamber is provided when carrying in to the first transfer chamber from the container, and wherein the carry out cooling chamber is provided when carrying out the substrate of the first transfer chamber to the container.

According to an embodiment, the first treating unit comprises a first heat treatment chamber configured to treat the substrate with heat and a first solution treatment chamber configured to treat the substrate with solution.

According to an embodiment, the first heat treatment chamber comprises a housing, a cooling unit, a heating unit, and a transfer unit, wherein the housing provides a treatment space in inside, wherein the cooling unit is configured to cool the substrate inside of the housing, wherein the heating unit is configured to heat the substrate inside of the housing, and wherein the transfer unit is configured to transfer the substrate in between the cooling unit and the heating unit.

According to an embodiment, the first transfer chamber, the cooling unit, and the heating unit are placed sequentially along the second direction.

According to an embodiment, the first heat treatment chambers is provided as a plurality of heat treatment chambers stacked to each other, and the first solution treatment chambers is provided as a plurality of solution treatment chamber stacked to each other.

According to an embodiment, the second treating unit comprises a second heat treatment chamber configured to treat the substrate with heat, and a second solution treatment chamber configured to treat the substrate with solution, wherein the load port, the index robot, the first transfer chamber and the first solution treatment chamber are placed sequentially along the first direction, and wherein the first heat treatment chamber, the first transfer chamber, the second transfer chamber, and the second heat treatment chamber are placed sequentially along the second direction.

According to an embodiment, the first solution treatment chamber comprises a chamber forming a film on a rotating substrate by providing a solution.

According to an embodiment, the first heat treatment chamber, the first solution treatment chamber, and the first buffer unit are placed different sides of the first transfer chamber from each other.

According to an embodiment, the first transfer robot comprises a base fixedly installed on the ground, a vertical shaft provided to rotate and move vertically, and a hand installed on the vertical shaft and provided to move front and back.

According to an embodiment, the first transfer chamber and the second transfer chamber are placed adjacently.

According to an embodiment, the first treating unit comprises a first heat treatment chamber treating a substrate with heat and a solution treatment chamber treating a substrate with solution, wherein the first heat treatment chambers is provided as a plurality of heat treatment chamber stacked to each other, wherein the first solution treatment chambers is provided as a plurality of solution treatment chamber stacked to each other and comprises a chamber forming a film on a rotating substrate by providing a solution. The load port, the index robot, the first transfer chamber and the first solution treatment chamber are placed sequentially along the first direction. The first heat treatment chamber, the first transfer chamber, the second transfer chamber, and the second heat treatment chamber are placed sequentially along the second direction, wherein the first transfer chamber and the second transfer chamber are placed adjacently to each other.

According to an embodiment, the first treating unit and the first transfer chamber are provided to be symmetry based on a parallel line to the second direction.

According to an embodiment, the substrate treating apparatus comprises an index module, buffer module and a treating module which are placed sequentially along the first direction. The index module comprises a load port where a substrate receiving container places and an index module configured to transfer the substrate between the load port and the buffer module. The buffer module comprises a first buffer unit and a second buffer unit which are arranged along a second direction perpendicular to the first direction, when viewed from a top side. The treating module comprises a first and second heat treatment chambers, a first and second solution treatment chambers, a first transfer chamber, and a second transfer chamber, wherein the first and second heat treatment chambers treat the substrate with heat, wherein the first and second solution treatment chambers treats the substrate with solution, wherein the first transfer chamber is provided with a first transfer robot transferring the substrate among the first heat treatment chamber, the first solution treatment chamber, and the first buffer unit, and wherein the second transfer chamber is provided with a second transfer robot transferring the substrate among the second heat treatment chamber, the second solution treatment chamber, and the second buffer unit. The first transfer chamber and the second transfer chamber are arranged along the second direction, and placed adjacently.

According to an embodiment, the load port, the index robot, the first transfer chamber and the first solution treatment chamber are placed sequentially along the first direction. The first heat treatment chamber, the first transfer chamber, the second transfer chamber, and the second heat treatment chamber are placed sequentially along the second direction.

According to an embodiment, the first heat treatment chamber, the first solution treatment chamber, and the first buffer unit are placed different sides of the first transfer chamber from each other.

According to an embodiment, the first transfer chamber and the second transfer chamber are placed adjacently to each other.

According to an embodiment of the present invention, processing hours may be shortened.

Also, according to an embodiment of the present invention, a moving distance and time of the transfer robot may be decreased.

Also, according to an embodiment of the present invention, the substrate treating apparatus may be miniaturized.

Also, according to an embodiment of the present invention, an unnecessary vortex generating from inside of the substrate treating apparatus may be minimized.

The objects of the inventive concept are not limited to the above mentioned effects. Other objects thereof will be understandable by those skilled in the art from the following descriptions and the present application.

DETAILED DESCRIPTION

Various example embodiments will be described more fully hereinafter with reference to the accompanying drawings, in which some example embodiments are shown. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Therefore, features of the drawings are exaggerated to emphasize definite explanation.

In an exemplary embodiment, a semiconductor wafer is explained as an example of the substrate. However, the substrate may be variety kinds of substrate like flat display panel, photo mask, and etc. other than wafer.

Figure 1:
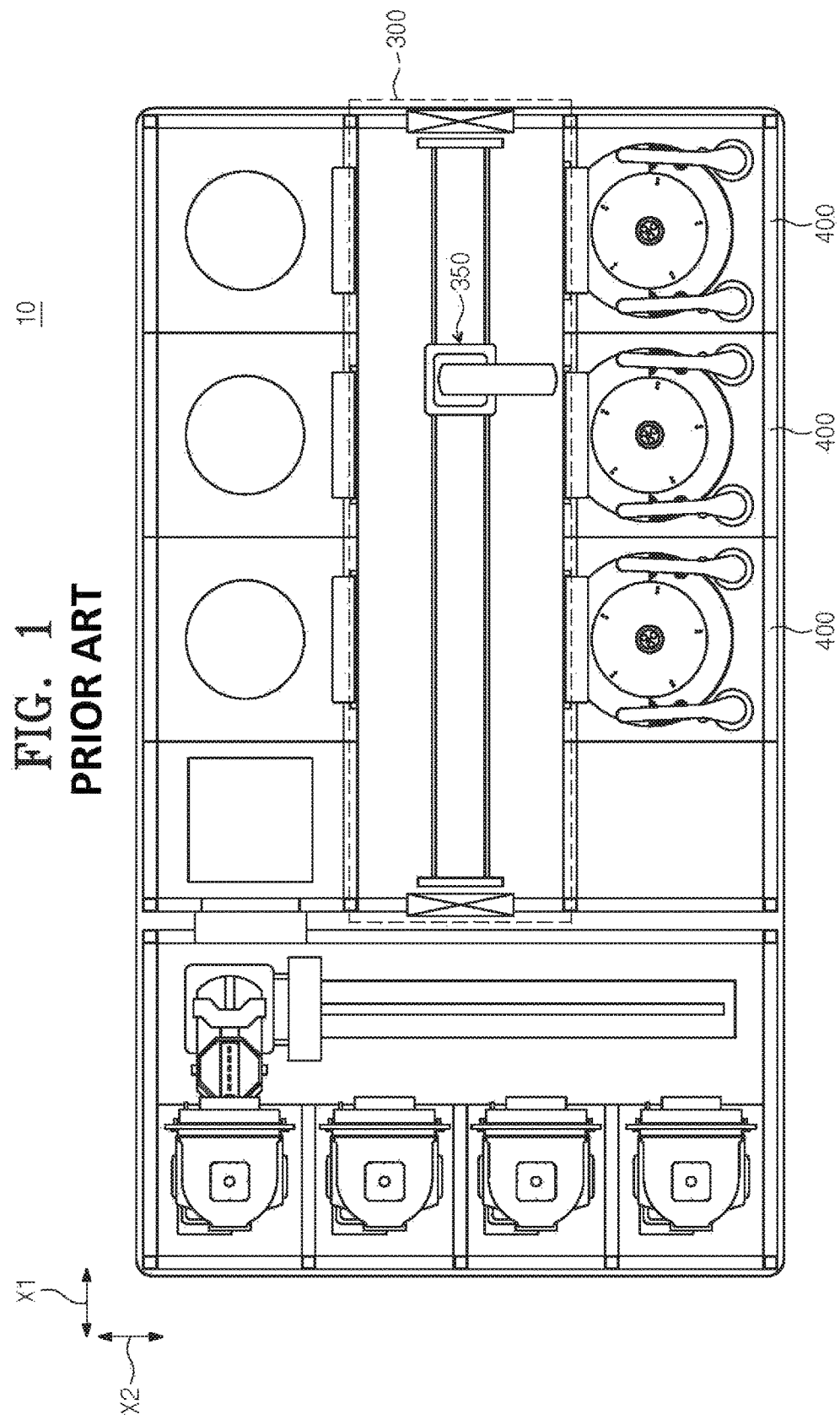
FIG. 1 is a plan view of the conventional substrate treating apparatus.
Figure 2:
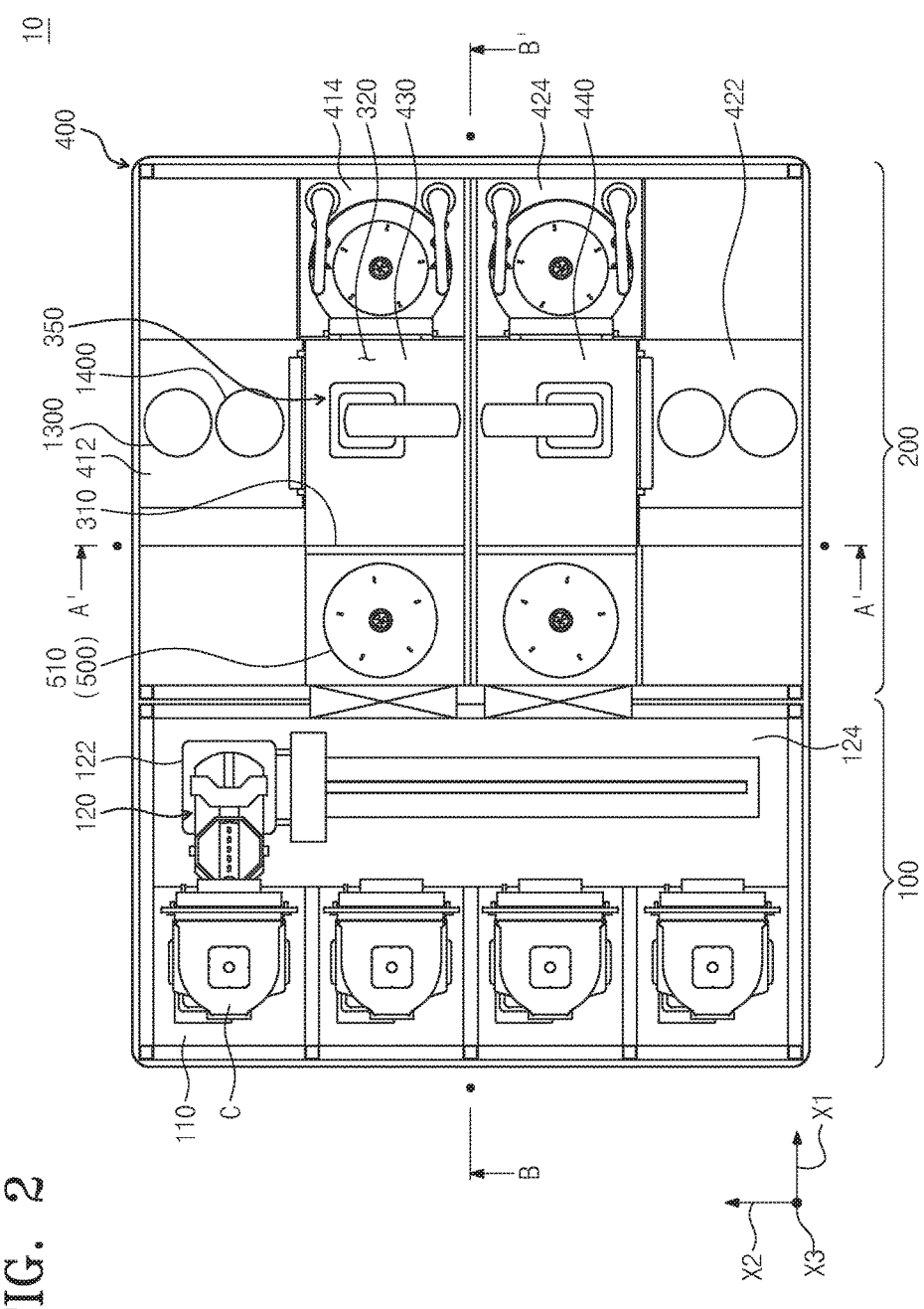
FIG. 2 is a plan view of the substrate treating apparatus in accordance with an embodiment of the present application.
Figure 3:
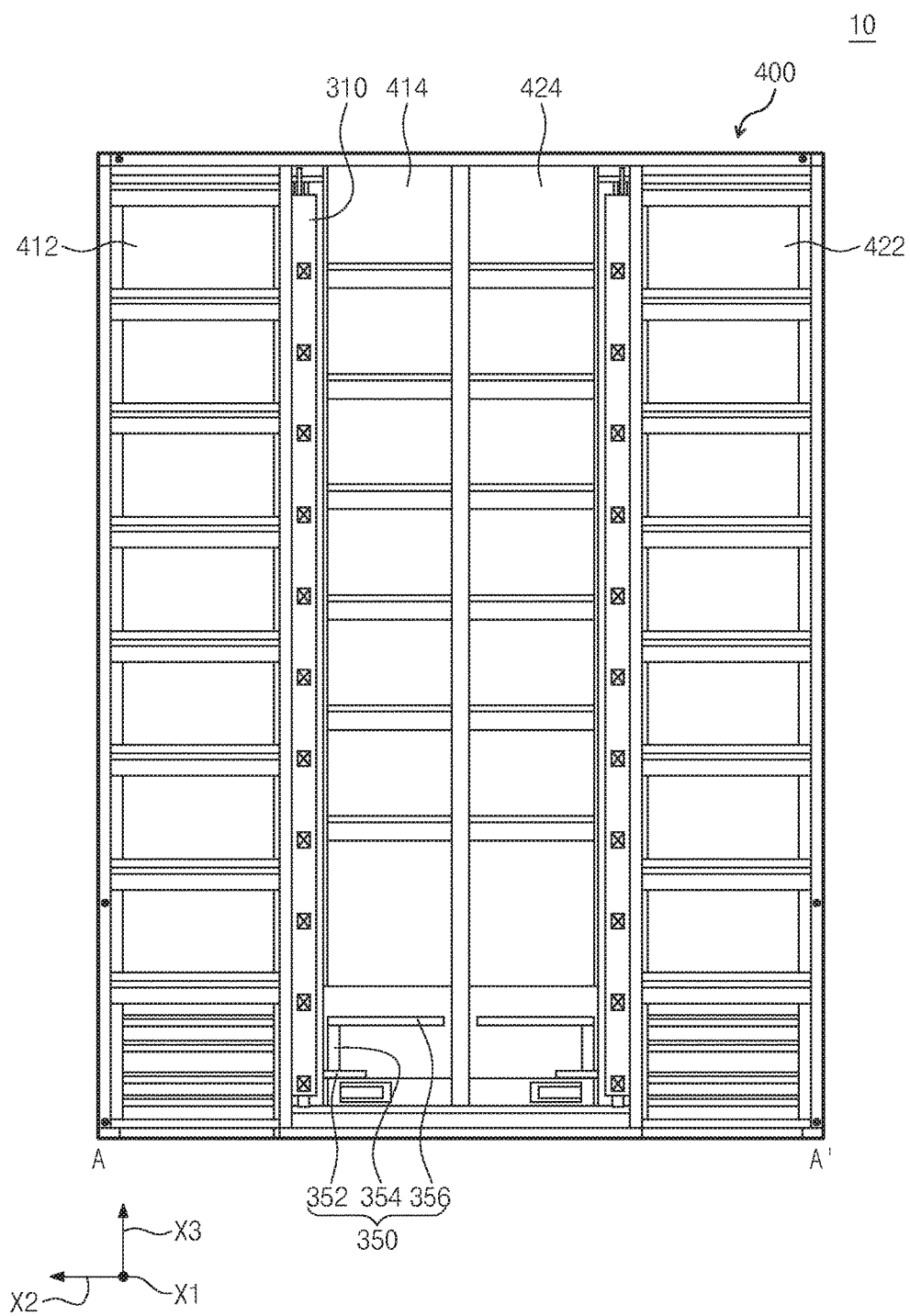
FIG. 3 is a cross sectional view of the substrate treating apparatus cut along an A-A' line of the FIG. 2.

FIG. 2 is a plan view of the substrate treating apparatus in accordance with an embodiment of the present application. FIG. 3 is across sectional view of the substrate treating apparatus cut along an A-A' line of the FIG. 2, and FIG. 4 is a cross sectional view of the substrate treating apparatus cut along a B-B' line of the FIG. 2.

Figure 4:
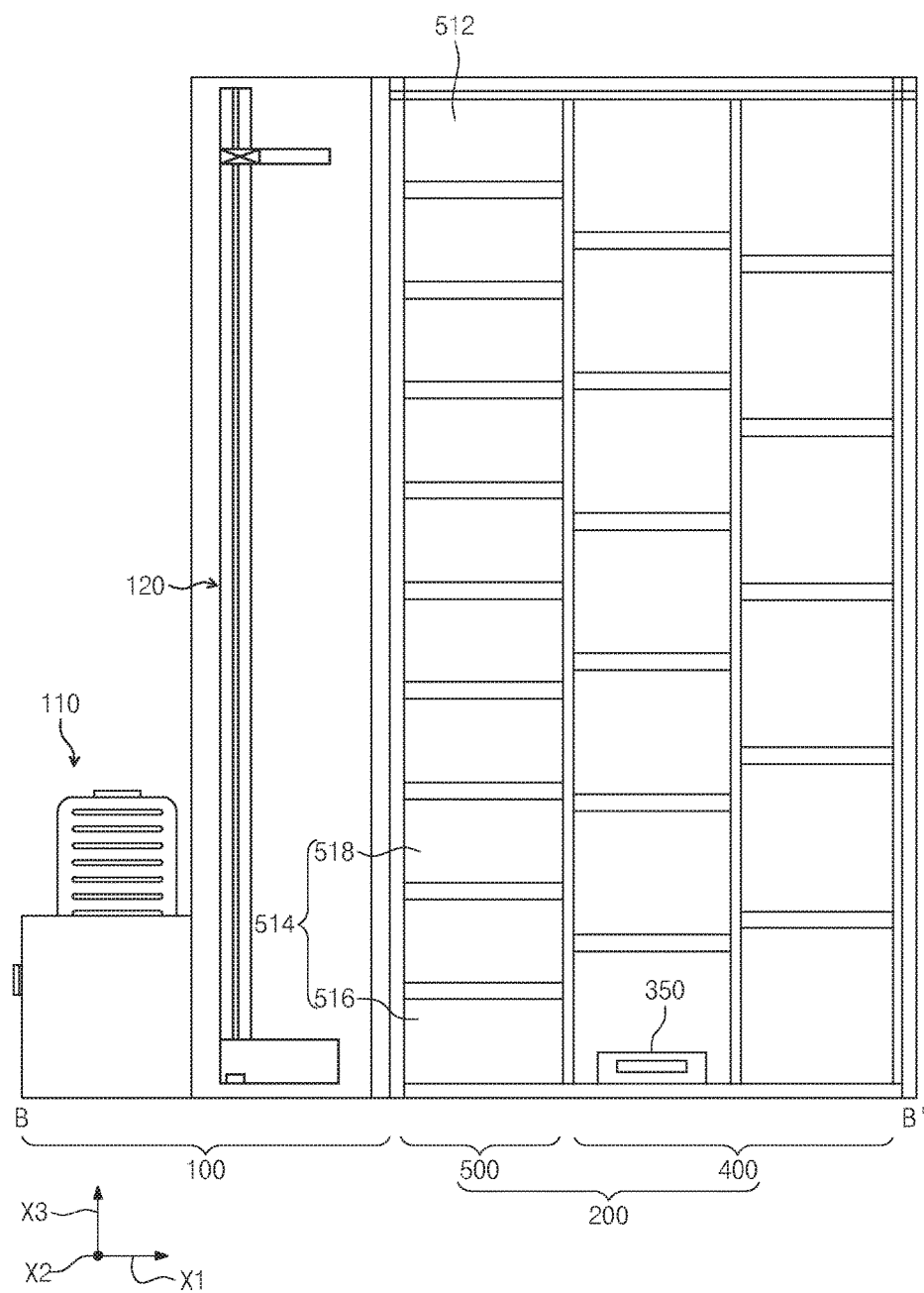
FIG. 4 is a cross sectional view of the substrate treating apparatus cut along a B-B' line of the FIG. 2.
Figure 5:
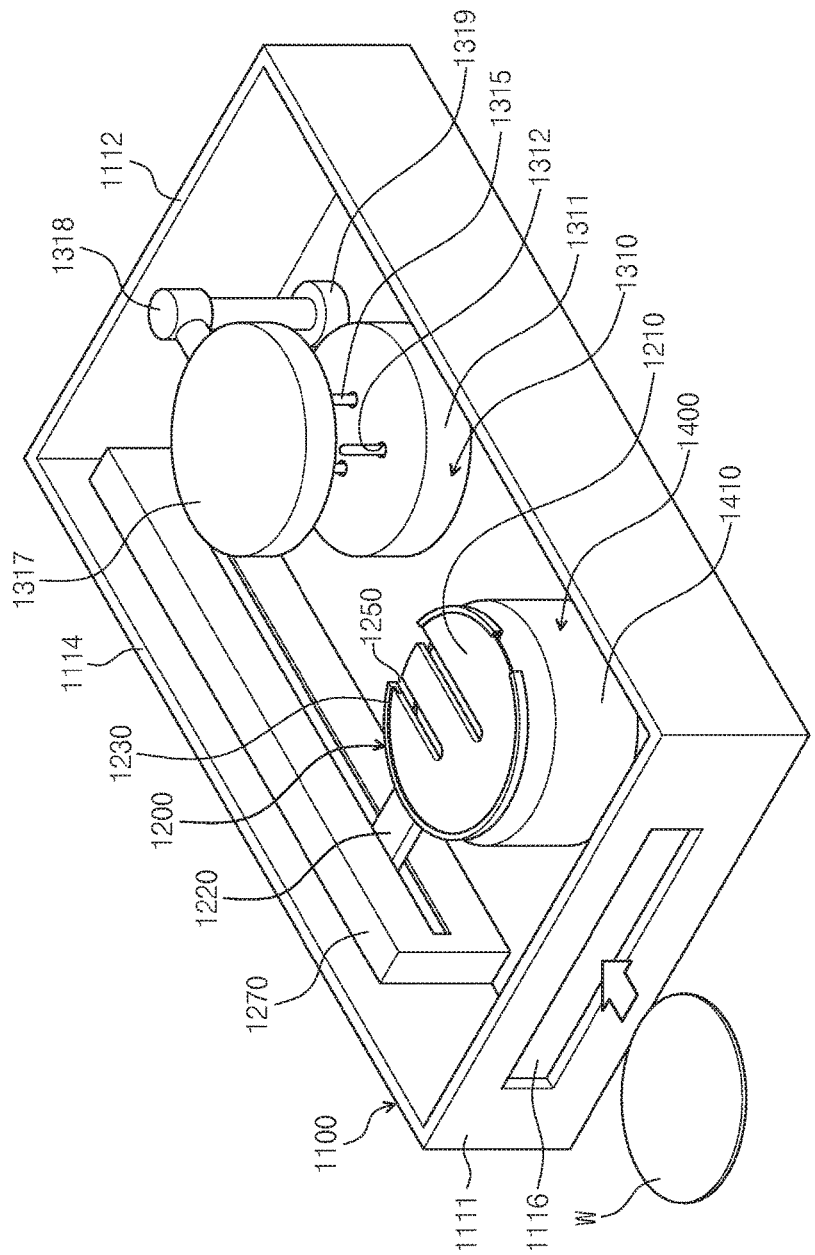
FIG. 5 is a perspective view of the first heat treatment chamber of the substrate treating apparatus of the FIG. 2.
Figure 6:
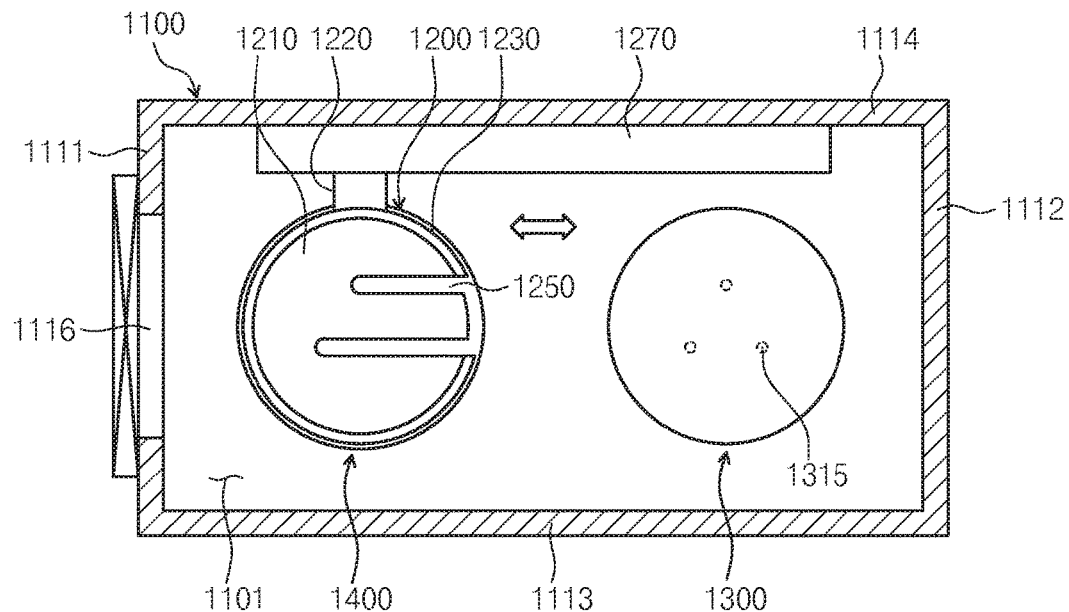
FIG. 6 is a plan view of the first heat treatment chamber of the FIG. 5.
Figure 7:
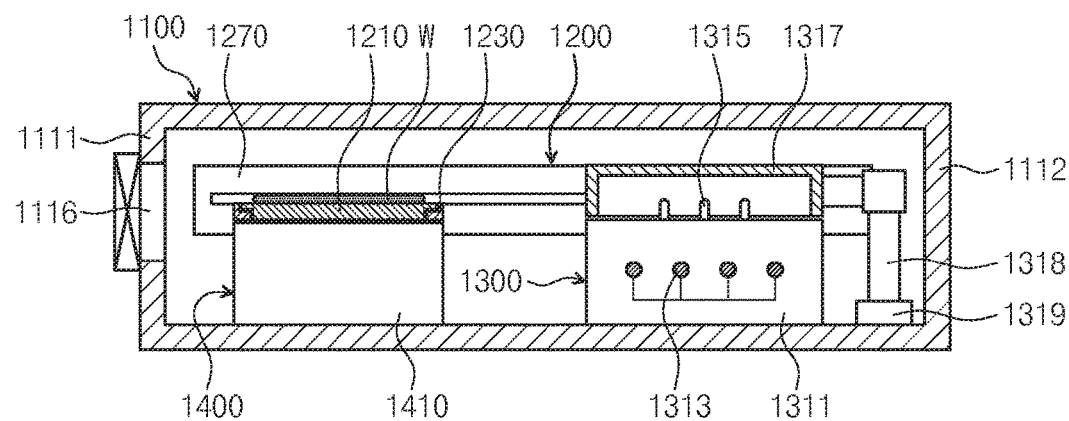
FIG. 7 is a cross sectional view of the first heat treatment chamber of the FIG. 5.

Referring to FIGS. 2 to 4, a substrate treating apparatus 10 comprises an index module 100 and a process treating module 200.

The index module 100 and the process treating module 200 are placed in a row along a first direction. When viewed from a top side, a direction perpendicular to the first direction is referred as a second direction, and a direction perpendicular to the both first and second directions is referred as a third direction.

The index module 100 is installed in front part of the process treating module 200. The index module 100 is placed along the first direction X1 at the one side of the process treating module 200. The index module 100 is an index device transferring the wafer W in between the process treating module 200 and a cassette C storing a plurality of wafer W. The index module 100 comprises load ports 110 and a transfer unit 120. The load ports 110 are placed in a row along the second direction X2, and the transfer unit 120 is placed in between the load ports 110 and the process treating module 200. The cassette C receiving substrates is placed on load ports by transfer means (not described) such as Overhead Transfer, Overhead Conveyor, or Automatic Guided Vehicle. The cassette C may be used as a sealing containers like front open unified pod (FOUP).

The transfer unit 120 transfers the wafer W between the process treating module 200 and the C seated on the load port 110. The transfer unit 120 has an index robot 122 and a transfer passageway 124, wherein the transfer passageway is provided as a passage for the index robot 122 to move along the second direction X2.

During process, the index robot 122 is moved along the transfer passageway 124 and transfers the wafer W between the cassette C and the process treating module 200. Herein transferring the wafer W between the index module 100 and the process treating module 200 happens through a gateway formed between the process treating module 200 and the index module 100.

The process treating module 200 comprises a treating module 400 and a buffer module 500.

The treating module 400 comprises a first treating unit 410, a second treating unit 420, a first transfer chamber 430, and a second transfer chamber 440. The first and second treating units 410, 420 perform certain semiconductor manufacturing processes. For example, the first treating unit 410 and the second treating unit 420 may perform a coat process coating solution on the wafer W, or a bake process heating or cooling the substrate.

The first treating unit 410 is explained in below.

The first treating unit 410 comprises a first heat treatment chamber 412, a first solution treatment chamber 414, and a first solution providing chamber 416. The first heat treatment chamber 412 treats the substrate with heat. For example, the first heat treatment chamber 412 performs processes such as prebake, soft bake, and/or a cooling process. The prebake process removes moisture or organic substances on the surface of the substrate W by heating the substrate W with a certain temperature before coating a solution on the substrate W. The soft bake process happens after coating a treatment solution on the substrate W, and the cooling process cools the substrate W after each heating processes.

The first heat treatment chamber 412 comprises a housing 1100, a transfer unit 1200, a heating unit 1300, and a cooling unit 1400.

The housing 1100 provides a treatment space in inside for a process like the bake process to happen. The housing 1100 may be provided as a rectangular form. The housing comprises a first side wall 1111, a second side wall 1112, a third side wall 1113, and a fourth side wall 1114.

The first side wall 1111 is provided in one side of the housing 1100. A gateway 1116 where the substrate W enters is formed in the first side wall 1111. The gateway 1116 provides a substrate W passageway.

The second side wall 1112 is formed in opposite side of the first side wall 1111. The second side wall 1112 is provided parallel to the first side wall 1111. The third side wall 1113 is provided in between the first side wall 1111 and the second side wall 1112. The third side wall 1113 is provided perpendicular to each of the first side wall 1111 and the second side wall 1112. The fourth side wall 1114 is provided in between the first side wall 1111 and the second side wall 1112. The fourth side wall 1114 is provided perpendicular to each of the first side wall 1111 and the third side wall 1113. The fourth side wall 1114 is provided parallel to the third side wall 1113.

The transfer unit 1200 moves the substrate W between the heating unit 1300 and the cooling unit 1400 inside of the housing 1100. The transfer unit 1200 comprises a transfer plate 1210, a support arm 1220, a support ring 1230, and a driving member 1270.

The substrate W is placed on the transfer plate 1210. The transfer plate 1210 is provided as a circular form. The transfer plate 1210 may be provided with the same size to the substrate W. The transfer plate 1210 may be provided as a metal material that has good heat conductivity. A guide hole 1250 is formed in the transfer plate 1210. The guide hole 1250 is a space to receive a lift pin 1315. The guide hole 1250 is provided as to extend from outer side of the transfer plate 1210 to the inner side of the transfer plate 1210. The guide hole 1250 prevents interference or crash with the lift pin 1315 when the transfer plate 1210 moves.

The support arm 1220 is fixedly connected to the transfer plate 1210. The support arm 1220 is provided in between the transfer plate 1210 and the driving member.

The support ring 1230 is provided surrounding the transfer plate 1210. The support ring 1230 supports edge of the transfer plate 1210. The support ring 1230 plays a role supporting the substrate W to be placed in the right position after the substrate W is placed on the transfer plate 1210.

The driving member 1270 may transfer or transport the transfer plate 1210. The driving member 1270 is provided to move the transfer plate 1210 linearly and/or up and down (vertically).

The heating unit 1300 heats the substrate by supporting the substrate. The heating unit 1300 comprises a plate 1311, a pin hole 1312, a heater 1313, the lift pin 1315, a cover 1317, and a driver 1319.

The plate 1311 is provided as a cylinder form. The plate 1311 may be provided as a material having good heat conductivity. For example, the plate 1311 may be provided as a metal material. The pin hole 1312 for receiving the lift pin 1315 is formed on top of the plate 1311.

The heater 1313 heats the substrate W. The heater 1313 is provided inner side of the plate 1311. For example, the heater 1313 may be installed as a heating coil inside of the plate 1311. Unlike this, the plate 1311 may be provided with heating patterns. The heater 1313 is provided inside of the plate 1313 and therefore the plate 1313 is heated priory before the substrate is heated.

The pin hole 1312 is provided as a passageway for the lift pin 1315 when the lift pin 1315 moves the substrate W up and down. The pin hole 1312 is provided on top of the plate 1311 and may be provided with a plurality of numbers.

The lift pin 1315 is moved up and down by an elevator device (not described). The lift pin 1315 may seat the substrate W on the plate 1311. The lift pin 1315 may elevate the substrate W to a position that is certain spaced apart from the plate 1311.

The cover 1317 places on top on of the plate 1311. The cover 1317 is provided as a cylinder form. The cover 1317 provides a heating space in its inside. The cover 1317 is moved on top of the plate 1311 by the driver 1319 when the substrate W moves to the plate 1311. When the substrate W is heated by the plate 1311, the cover 1317 moves downward by the driver 1319 and forms a heating space for heating the substrate W.

The driver 1319 is fixedly connected with the cover 1317 by a supporting part 1318. The driver 1319 elevates the cover 1317 up and down when the driver 1319 is transferred or transported to the plate 1311. For example, the driver 1319 may be provided as a cylinder driver.

The cooling unit 1400 plays a role cooling the plate 1311 or the substrate W where a treatment is finished. The cooling unit 1400 places inner side of the housing 1100. The cooling unit 1400 places more adjacently to the first side wall 1111 than to the second side wall 1112. The cooling plate 1400 comprises a cooling plate 1410.

The cooling plate 1410 cools the substrate. The cooling plate 1410 may be provided as a circular form. The cooling plate 1410 may be provided with a size corresponding to the substrate. Inside of the cooling plate 1410, a cooling channel may be provided. In the cooling channel, a cooling water may be provided to cool the substrate W. The transfer plate 1210 is placed on the cooling plate 1410 when the substrate is maintained in the transfer plate 1210, and the substrate may be cooled.

The first solution treatment chamber 414 coats solution on the substrate. The first solution treatment chamber 414 may form a film on the rotating substrate by providing a solution. A plurality of the first solution treatment chambers 414 may be stacked along the third direction X3.

The first solution providing chamber 416 may be stacked on the first solution treatment chamber 414. The first solution providing chamber 416 and the first solution treatment chamber 414 may be stacked along the third direction X3. The first solution providing chamber 416 may be placed under the first solution treatment chamber 414. The first solution providing chamber 416 is provided to the first solution treatment chamber 414 and stores a treatment solution treating the substrate with solution. The treatment solution is provided to the first solution treatment chamber 414 in a solution providing chamber.

The second treating unit 420 is provided corresponding to the first treating unit 410 based on the parallel line to the second direction X2. Also, the second treating unit 420 is provided the same with the first treating unit 410. The second treating unit 420 performs the same function with the first treating unit 410. The second treating unit 420 comprises a second heat treatment chamber 422, a second solution treatment chamber 424, and a second solution providing chamber 426. The second heat treatment chamber 422, the second solution treatment chamber 424, and the second solution providing chamber 426 are provided corresponding to the first heat treatment chamber 412, the first solution treatment chamber 414, and the first solution providing chamber 416, respectively.

The first transfer chamber 430 comprises a frame 310 and the first transfer robot 350.

Inside of the frame 310, a moving route 320 where the first transfer robot 350 moves is provided. The moving route 320 is provided along the third direction X3. During a process, the first transfer robot 350 moves along the moving route 320, and transfers a wafer between the index module 100 and the treating module 400.

The first transfer robot 350 comprises a base 352, a vertical shaft 354, and a hand 356. The base 352 is fixedly installed on the ground. The vertical shaft 354 is provided to move up and down and rotatable from the base 352. The vertical shaft 354 is provided to extend along the third direction which is perpendicular to the first direction X1 and the second direction X2. The hand 356 is provided to move front and back with respect to the vertical shaft 354. That is, the hand 356 is provided to move to the first direction X1 and the second direction X2.

The second transfer chamber 440 is provided corresponding to the first transfer chamber 430 based on the parallel line to the second direction X2. Also, the second transfer chamber 440 is provided the same with the first transfer chamber 430. The second transfer robot performs the same function with the first transfer robot 350. The second transfer robot is provided corresponding to the first transfer robot 350. The second transfer chamber 440 is provided adjacently to the first transfer chamber 430. The second transfer chamber 440 and the first transfer chamber 430 are arranged along the first direction X1.

A buffer module 500 provides a space for a substrate transferred between the process treating module 200 and the index module 100 to stay temporarily. The buffer module 500 is placed between the process treating module 200 and the index module 100.

The buffer module 500 comprises a first buffer unit 510 and a second buffer unit 520. The first buffer unit 510 and the second buffer unit 520 are arranged along the first direction X1. When viewed from a top side, the second direction X2 is a direction perpendicular to the second direction X2. The first buffer unit 510 and the first transfer chamber 430 are arranged along the first direction X1.

The first buffer unit 510 comprises a first buffer chamber 512 and a first cooling chamber 514. The first buffer chamber 512 provides a space where the substrate temporarily stays. The first cooling chamber 514 is stacked with the first buffer chamber 512. The first cooling chamber 514 and the first buffer chamber 512 are stacked along the third direction X3. The first cooling chamber 514 cools the substrate. The first cooling chamber 514 comprises a carry in cooling chamber 516 and a carry out cooling chamber 518. The carry in cooling chamber 516 is provided with one or a plurality of numbers. A plurality of carry in cooling chambers 516 may be stacked along the third direction.

The carry in cooling chamber 516 cools a substrate carried in to the first transfer chamber 430 from a container like the cassette C. The carry out cooling chamber 518 is provided with one or a plurality of numbers. A plurality of the carry out cooling chambers 518 may be stacked along the third direction. The carry out cooling chamber 518 cools a substrate carried out from the first transfer chamber 430 as a container.

A second buffer unit 520 is provided the same with the first buffer unit 510. The second buffer unit 520 is provided adjacently to the first buffer unit 510. The first buffer unit 510 and the second buffer unit 520 are arranged along the first direction X1. The second buffer unit 520 and the second transfer chamber 440 are arranged along the second direction X2.

The first transfer chamber 430, the cooling unit 1400, and the heating unit 1300 may be arranged in this order along the second direction X2. Therefore, the substrate is loaded on the cooling unit 1400 through the gateway 1116 from the first transfer chamber 430, and then transferred to the heating unit 1300 and the substrate may be treated with heat.

The first buffer unit 510, the first heat treatment chamber 412, and the first solution treatment chamber 414 are placed on the different sides of the first transfer chamber 430. For example, the first transfer chamber 430 is provided in rectangular form, and the first buffer unit 510, the first heat treatment chamber 412, and the first solution treatment chamber 414 are each provided adjacently to other different sides among the four sides of the first transfer chamber 430. Also, in the remaining side of the first transfer chamber 430, the second transfer chamber 440 is provided adjacently.

For example, in one side adjacent to the second direction X2 in the first transfer chamber 430, the first heat treatment chamber 412 is provided. In other side adjacent to the second direction X2 in the first transfer chamber 430, the second transfer chamber 440 is provided adjacently. In one side adjacent to the first direction X1 in the first transfer chamber 430, the first buffer unit 510 is provided. In other side adjacent to the first direction X1 in the first transfer chamber 430, the first solution treatment chamber 414 is provided.

Hereinafter explains a method for treating a substrate using the above described substrate treating apparatus.

The first treating unit 410 and the first transfer chamber 430 are provided symmetrically with the second treating unit 420 and the second transfer chamber 440 based on a parallel line to the first direction X1. Therefore, processes through the first transfer chamber 430 and the first treating unit 410 are the same with the processes through the first transfer chamber 430 and the first treating unit 410.

The load ports 110, the index robot 122, the first transfer chamber 430, and the first solution treatment chamber 414 are placed in order along the second direction X2. The substrate is inserted in the first transfer chamber 430 through the index module 100 and the buffer module 500 in order. When viewed from a top side, the first transfer robot 350 moves to the third direction which is perpendicular to the first direction X1 and the second direction X2. Specifically, the vertical shaft 354 moves vertically along the third direction. The first heat treatment chamber 412 and the first solution treatment chamber 414 are placed adjacently to different sides of the first transfer chamber 430, and therefore the vertical shaft 354 of the first transfer robot 350 does not have to move to the first direction X1 or to the second direction X2, as compared to the conventional apparatus. Therefore, a processing time may be shortened by shortening a moving time of the transfer robot of the present invention. Also, a process defect may be prevented by minimizing unnecessary vortex or flow by narrowing a moving section of the transfer robot.

When reaching the first solution treatment chamber 414 stacked with a plurality of numbers, or a height of the first heat treatment chamber 412, the hand 356 moves horizontally to the vertical shaft 354 and inserts the substrate into the first solution treatment chamber 414 or the first heat treatment chamber 412. Then the substrate treating process is performed.

Also, the load ports 110, the index robot 122, the second transfer chamber 440, and the second solution treatment chamber 424 are placed in order along the second direction X2. The first heat treatment chamber 412, the first transfer chamber 430, the second transfer chamber 440, and the second heat treatment chamber 422 are placed in order along the first direction X1. A treating process, where the substrate is inserted through the second transfer chamber 440, processes the same with a process, when the substrate is inserted through the described first transfer chamber 430. Therefore, as compared to the conventional apparatus, the transfer chamber is composed of a plurality of numbers so a time of transferring the substrate is shortened and thereby processing time may be shortened.

Foregoing embodiments are examples of the present invention. Further, the above contents merely illustrate and describe preferred embodiments and embodiments may include various combinations, changes, and environments. That is, it will be appreciated by those skilled in the art that substitutions, modifications and changes may be made in these embodiments without departing from the principles and spirit, the scope of which is defined in the appended claims and their equivalents. Further, it is not intended that the scope of this application be limited to these specific embodiments or to their specific features or benefits. Rather, it is intended that the scope of this application be limited solely to the claims which now follow and to their equivalents.

What is claimed is:

1. A substrate treating apparatus comprising:
   an index module;
   a buffer module; and
   a treating module,
   wherein the index module, the buffer module, and the treating module are sequentially placed along a first direction,
   wherein the index module comprises a load port where a substrate receiving container is placed and an index robot configured to transfer the substrate between the load port and the buffer module,
   wherein the buffer module comprises a first buffer chamber and a second buffer chamber arranged along a second direction perpendicular to the first direction, when viewed from a top side of the substrate treating apparatus,
   wherein the treating module comprises a first treating chamber, a second treating chamber, a first transfer chamber provided with a first transfer robot configured to transfer the substrate between the first buffer chamber and the first treating chamber, and a second transfer chamber provided with a second transfer robot configured to transfer the substrate between the second buffer chamber and the second treating chamber,
   wherein the first transfer chamber and the second transfer chamber are arranged along the second direction, and
   wherein the first transfer robot and the second transfer robot move along and rotate about a base fixedly installed on a ground vertically along a third direction perpendicular to the first and second directions.

2. The apparatus of claim 1, wherein the first buffer chamber comprises:
   a first cooling chamber configured to cool the substrate and stacked with the first buffer chamber.

3. The apparatus of claim 2, wherein the first cooling chamber comprises:
   one or a plurality of carry in cooling chambers provided when the substrate is carried in to the first transfer chamber from the substrate receiving container; and
   one or a plurality of carry out cooling chambers provided when the substrate is carried out of the first transfer chamber to the substrate receiving container.

4. The apparatus of claim 1, wherein the first treating chamber comprises:
   a first heat treatment chamber configured to treat the substrate with heat; and
   a first solution treatment chamber configured to treat the substrate with solution.

5. The apparatus of claim 4, wherein the first heat treatment chamber comprises:
   a housing providing a treatment space therein;
   a cooler cooling the substrate inside of the housing;
   a heater heating the substrate inside of the housing; and
   a third transfer robot transferring the substrate in between the cooler and the heater.

6. The apparatus of claim 5, wherein the first transfer chamber, the cooler, and the heater are placed sequentially along the second direction.

7. The apparatus of claim 4, wherein the first heat treatment chamber includes a plurality of chambers stacked to each other, and the first solution treatment chamber includes a plurality chambers stacked to each other.

8. The apparatus of claim 4, wherein the second treating chamber comprises:
   a second heat treatment chamber configured to treat the substrate with heat; and
   a second solution treatment chamber configured to treat the substrate with solution,
   wherein the load port, the index robot, the first transfer chamber and the first solution treatment chamber are placed sequentially along the first direction, and
   wherein the first heat treatment chamber, the first transfer chamber, the second transfer chamber, and the second heat treatment chamber are placed sequentially along the second direction.

9. The apparatus of claim 4, wherein the first solution treatment chamber comprises a chamber forming a film on a rotating substrate by providing a solution.

10. The apparatus of claim 4, wherein the first heat treatment chamber, the first solution treatment chamber, and the first buffer chamber are placed at different sides of the first transfer chamber from each other.

11. The apparatus of claim 1, wherein the first transfer robot comprises:
a vertical shaft installed on the base and provided to rotate and move vertically; and
a hand installed on the vertical shaft and provided to move forward and backward,
wherein the base is fixedly installed on a ground.

12. The apparatus of claim 1, wherein the first transfer chamber and the second transfer chamber are placed adjacently.

13. The apparatus of claim 1, wherein the first treating chamber comprises:
a first heat treatment chamber treating the substrate with heat; and
a first solution treatment chamber treating the substrate with solution,
wherein the first heat treatment chamber is provided as a plurality of heat treatment chambers stacked to each other,
wherein the first solution treatment chamber is provided as a plurality of solution treatment chambers stacked to each other and comprise a chamber forming a film on a rotating substrate by providing a solution,
wherein the load port, the index robot, the first transfer chamber and the first solution treatment chamber are placed sequentially along the first direction,
wherein the first heat treatment chamber, the first transfer chamber, the second transfer chamber and a second heat treatment chamber are placed sequentially along the second direction, and
wherein the first transfer chamber and the second transfer chamber are placed adjacently to each other.

14. The apparatus of claim 1, wherein the first treating chamber and the first transfer chamber are provided with symmetry based on a parallel line to the first direction.

15. A substrate treating apparatus comprising:
an index module;
a buffer module; and
a treating module which are placed sequentially along a first direction,
wherein the index module comprises a load port where a substrate receiving container is placed and an index robot configured to transfer the substrate between the load port and the buffer module,
wherein the buffer module comprises a first buffer chamber and a second buffer chamber arranged along a second direction perpendicular to the first direction, when viewed from a top side,
wherein the treating module comprises a first and second heat treatment chambers, a first and second solution treatment chambers, a first transfer chamber, and a second transfer chamber,
wherein the first and second heat treatment chambers treat the substrate with heat, the first and second solution treatment chambers treat the substrate with solution, the first transfer chamber is provided with a first transfer robot transferring the substrate among the first heat treatment chamber, the first solution treatment chamber, and the first buffer chamber, and the second transfer chamber is provided with a second transfer robot transferring the substrate among the second heat treatment chamber, the second solution treatment chamber, and the second buffer chamber,
wherein the first transfer chamber and the second transfer chamber are arranged along the second direction, and placed adjacently, and
wherein the first transfer robot and the second transfer robot move along and rotate about a base fixedly installed on a ground vertically along a third direction perpendicular to the first and second directions.

16. The apparatus of claim 15, wherein the load port, the index robot, the first transfer chamber and the first solution treatment chamber are placed sequentially along the first direction, and
wherein the first heat treatment chamber, the first transfer chamber, the second transfer chamber, and the second heat treatment chamber are placed sequentially along the second direction.

17. The apparatus of claim 15, wherein the first heat treatment chamber, the first solution treatment chamber, and the first buffer chamber are placed at different sides of the first transfer chamber from each other.

18. The apparatus of claim 15, wherein the first transfer chamber and the second transfer chamber are placed adjacently to each other.

* * * * *